United States Patent
Rometsch et al.

(10) Patent No.: US 10,872,833 B2
(45) Date of Patent: Dec. 22, 2020

(54) ELECTRONIC MODULE, METHOD

(71) Applicant: Robert Bosch GmbH, Stuttgart (DE)

(72) Inventors: Bernd Rometsch, Gerlingen (DE);
Georg Hejtmann, Mundelsheim (DE);
Martin Rittner, Ludwigsburg (DE);
Stefan Kaessner, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/474,785

(22) PCT Filed: Dec. 22, 2017

(86) PCT No.: PCT/EP2017/084292
§ 371 (c)(1),
(2) Date: Jun. 28, 2019

(87) PCT Pub. No.: WO2018/122145
PCT Pub. Date: Jul. 5, 2018

(65) Prior Publication Data
US 2019/0348338 A1 Nov. 14, 2019

(30) Foreign Application Priority Data
Dec. 28, 2016 (DE) .................. 10 2016 226 262

(51) Int. Cl.
*H01L 23/29* (2006.01)
*H01L 23/373* (2006.01)
*H01L 23/473* (2006.01)

(52) U.S. Cl.
CPC ........ *H01L 23/291* (2013.01); *H01L 23/3733* (2013.01); *H01L 23/473* (2013.01)

(58) Field of Classification Search
CPC . H01L 23/291; H01L 23/3733; H01L 23/473; H01L 2924/181; H01L 2224/40
(Continued)

(56) References Cited

U.S. PATENT DOCUMENTS 6,822,018 B2 * 11/2004 Chaudhuri ............... C08K 3/08
174/16.3
7,542,291 B2 * 6/2009 Karrer ................. H01L 23/3735
165/104.33

(Continued)

FOREIGN PATENT DOCUMENTS

DE 102007039916 2/2009
DE 102013112267 5/2015
(Continued)

OTHER PUBLICATIONS

International Search Report for Application No. PCT/EP2017/084292 dated May 9, 2018 (English Translation, 2 pages).

*Primary Examiner* — Vu A Vu
(74) *Attorney, Agent, or Firm* — Michael Best & Friedrich LLP

(57) ABSTRACT

The invention relates to an electronic module (6), in particular a power module, having at least one electrical/electronic component (7) and having a housing (8), which at least partly extends around the component (7), wherein the housing (8) is made of cement composite (1), and wherein the cement composite (1) has at least one particulate filler (2). According to the invention, the particulate filler (2) has aluminum nitride particles (3), which each have a coating only of aluminum oxide (4).

11 Claims, 2 Drawing Sheets

(58) Field of Classification Search
USPC .......................................................... 257/787
See application file for complete search history.

(56) References Cited

U.S. PATENT DOCUMENTS

| | | | |
|---|---|---|---|
| 9,249,293 B2* | 2/2016 | Takezawa | ............... C08L 63/00 |
| 2004/0105980 A1 | 6/2004 | Sudarshan et al. | |
| 2017/0365541 A1* | 12/2017 | Eisele | ................. H01L 23/4334 |

FOREIGN PATENT DOCUMENTS

| | | |
|---|---|---|
| EP | 2958139 | 12/2015 |
| JP | H04175209 A | 6/1992 |
| JP | 2016535464 A | 11/2016 |
| WO | 2011102421 A1 | 8/2011 |
| WO | 2015137263 | 9/2015 |

* cited by examiner

ELECTRONIC MODULE, METHOD

BACKGROUND OF THE INVENTION

The invention relates to an electronic module, especially power module, having at least one electrical/electronic component and having a housing that at least partly surrounds the component, wherein the housing is manufactured from cement composite, and wherein the cement composite includes cement and at least one particulate filler.

The invention further relates to a process for producing such an electronic module.

Electronic modules of the type specified at the outset are known from the prior art. For instance, published specification EP 2 958 139 A1 describes a semiconductor module having at least one semiconductor component covered by an encapsulating compound consisting of cement. The encapsulating compound includes a filler in the form of aluminum nitride particles or alumina particles and hence forms a cement composite. Document US 2004/0105980 A1 describes particles that may have a particle core and a multitude of coatings surrounding the particle core.

SUMMARY OF THE INVENTION

What is envisaged in accordance with the invention is that the particulate filler includes aluminum nitride particles each having a coating solely of alumina. This results in the advantage that the aluminum nitride particles are arrangeable/integratable in a protected manner in the cement, such that the thermal conductivity of the aluminum nitride particles (thermal conductivity of aluminum nitride: 180 W/mK) is utilizable to increase the thermal conductivity of the cement composite. What is meant here by "protected" is that the aluminum nitride does not react with the cement owing to the coating with alumina and dissolve or break down as it does so. The enhanced thermal conductivity of the cement composite assures particularly effective conduction of heat. If the temperature of a component encapsulated especially by a housing of cement composite, for example a transistor, rises during operation, for example owing to power losses during a switching operation, the heat that arises is rapidly and reliably dissipated from the component into the cement composite.

In a preferred development of the invention, the filler is distributed homogeneously in the cement composite. The advantage here is that the thermal conductivity is the same throughout the cement composite. This assures optimal conduction of heat from the component into the cement composite. What this especially prevents is that regions in the cement composite have only a small proportion of filler, if any, and so the component is damaged because conduction of heat is too low and hence evolution of heat is too high.

More preferably, the filler is a granular material or powder. The advantage here is that the filler is introduceable into and miscible with the cement in a simple manner. Moreover, an amount of the filler that is to be introduced into the cement is thus determinable or meterable in a simple manner. This assures exact meterability of the filler in the cement. Preferably, the filler, especially the aluminum nitride particles, has at least essentially a spherical shape. Moreover, it is preferably the case that the filler is in cavity-free form in order to avoid trapping of gas, which can especially react in a critical manner with the cement. Preferably, the diameter of the aluminum nitride particles themselves or that of the aluminum nitride particles additionally having the coating of alumina is at least 0.1 µm and at most 500 µm. The layer thickness of the coating of alumina is preferably at least 1 nm and at most 100 nm. Alternatively, the filler is in the form of a suspension.

Preferably, the cement or a base compound of the cement composite is manufactured from inorganic material. The advantage here is that the cement or the base compound of the cement composite is producible inexpensively and in a simple manner. Inorganic material is preferably cement, for example alumina cement, phosphate cement or portland cement. Preferably, the cement or the base compound of the cement composite additionally includes at least one inorganic additive, for example sand or rock.

In a preferred development of the invention, at least one further filler, especially nitridic ceramic particles or silicon carbide particles, has been introduced into the cement composite. The advantage here is that thermal and/or physical properties of the cement composite are adjustable or configurable in a controlled manner. A physical property is especially the thermal conductivity or heat conductivity, which is configurable via nitridic ceramic particles, for example boron nitride or silicon nitride. A further property is, for example, a hardness of the cement composite, especially a compressive strength, which is adjustable via the introduction of silicon carbide particles. Preferably, the further fillers likewise have a coating of alumina.

Preferably, at least one heat sink is assigned to the housing. The advantage here is that the heat sink avoids overheating of the component in operation of the component, so as to assure stable operation of the component. The heat sink releases the heat that arises in operation of the component, preferably via conduction of heat and/or convection, to a surrounding medium, for example air or water. Alternatively or additionally, the heat sink releases the heat that arises to the surrounding medium by thermal radiation. Preferably, the heat sink includes a material having a high thermal conductivity, for example copper. In order that the heat sink can effectively release and remove the heat, it preferably has cooling fins. These increase a heat-releasing or heat-removing surface area of the heat sink, which improves the release of heat to the surrounding medium. The component is preferably disposed on a substrate, for example a ceramic substrate. The heat sink is preferably disposed on an opposite side of the substrate from the component and is especially bonded to the substrate by means of a joining material, for example a metallic soft solder material or a polymeric TIM material.

It is more preferably the case that the heat sink takes the form of a coolant duct and extends through the cement composite such that sections of its longitudinal extent are surrounded completely by the cement composite. The advantage here is that the coolant duct, owing to its extent through the cement composite and its integration into the cement composite, particularly effectively absorbs heat and hence advantageously cools the electronic module. The coolant duct is preferably bonded in a form-fitting and/or cohesive manner to the cement composite by virtue of the integration within the cement composite. Preferably, the coolant duct is a copper tube through which a cooling liquid, for example water, or a cooling gas, for example air, flows or can flow. By virtue of only sections of the coolant duct being surrounded completely by the cement composite, the regions that are not surrounded by cement composite are especially assigned to the surrounding medium. This ensures that the coolant duct is coolable by the surrounding medium, which additionally improves removal of heat from the component to the surrounding medium. An alternative envisaged is that the coolant duct is arranged entirely within the cement composite. It is preferably the case that the electronic module has multiple heat sinks, for example a heat sink bonded to the substrate and a coolant duct integrated into the cement composite. Preferably, the coolant duct is in meandering form. The coolant duct alternatively or additionally releases the heat that arises in operation of the component preferably via phase transformation to the surrounding medium.

The process of the invention for producing an electronic module, especially power module, results in the advantages already mentioned. Further advantages and preferred features will be apparent more particularly from the above description and from the claims. For production of a castable cement composite compound, preferably the base compound, the additives and/or the fillers are mixed first with one another and then with water. Alternatively or additionally, in particular, the fillers are added to a castable cement compound consisting of the base compound and/or the at least one additive only after it has been produced.

It is preferably the case that, at least one heat sink is assigned to the housing. This results in the advantages already mentioned. Preferably, in the case of encapsulation of the component, the heat sink is also encapsulated with cement composite. This assures a form-fitting and/or cohesive and hence stable bond of the heat sink or of the coolant duct to the cement composite.

It is preferably the case that the aluminum nitride particles are provided with a coating solely of alumina by oxidizing the aluminum nitride particles. This results in a particularly simple and inexpensive operation for providing the aluminum nitride particles with a coating. The aluminum nitride particles are preferably oxidized at a temperature of 1200° C.

It is more preferably the case that the aluminum nitride particles are provided with a coating solely of alumina by applying the alumina to the aluminum nitride particles by means of a deposition process. The advantage here is that thus definable layer thicknesses of alumina are applicable to the aluminum nitride particles. What is meant by a deposition process is more particularly a coating process. For example, a deposition process is a chemical gas phase deposition or else a physical coating method. These include, for example, evaporation methods such as electron beam evaporation methods.

BRIEF DESCRIPTION OF THE DRAWINGS

The invention is to be elucidated in detail hereinafter with reference to the drawings. In this regard, the following is shown by the figures hereinafter.

DETAILED DESCRIPTION

Figure 1:
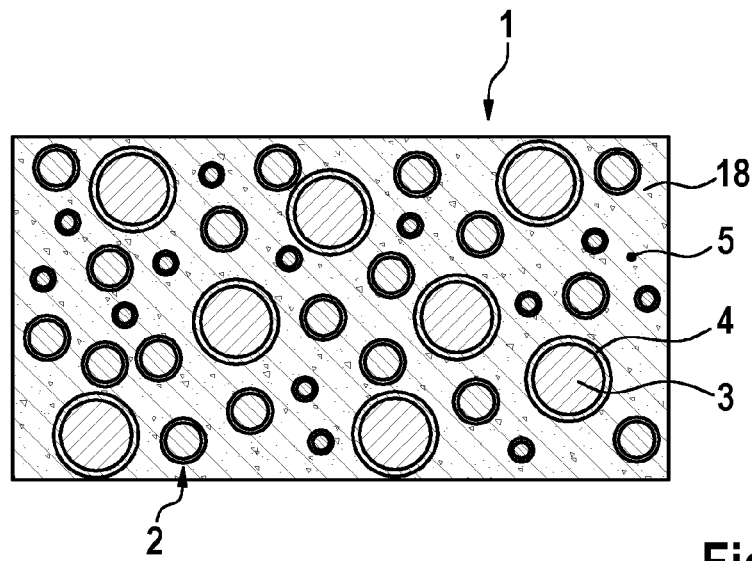
FIG. 1 a cement composite including at least one particulate filler in a simplified representation, FIG. 2 an electronic module with a housing to which at least one heat sink has been assigned in a simplified representation and FIG. 3 an overview diagram for performance of the process in an advantageous working example.

FIG. 1 shows, in a simplified representation, a cement composite 1 including cement 18 and a particulate filler 2. The particulate filler 2 includes aluminum nitride particles 3 each having a coating solely of alumina 4. The aluminum nitride particles 3 are preferably spherical and in cavity-free form. The diameter of the aluminum nitride particles 3 or of the aluminum nitride particles 3 having a coating of alumina 4 is preferably at least 0.1 µm and at most 500 µm. The alumina 4 preferably has a layer thickness of at least 1 nm and at most 100 nm.

The coating with alumina 4 prevents breakdown and dissolution of the aluminum nitride particles 3 in the cement 18. This ensures that the thermal properties, especially the high thermal conductivity of 180 W/mK of aluminum nitride, can advantageously be utilized for the thermal conductivity of the cement composite 1.

Preferably, the filler 2 is distributed homogeneously in the cement 18. This especially assures homogeneous conduction of heat by the cement composite 1.

Preferably, at least one further filler 5, especially nitridic ceramic particles or SiC particles, has been introduced into the cement composite 1. Nitridic ceramic particles are, for example, boron nitride (BN) or silicon nitride ($Si_3N_4$).

Figure 2:
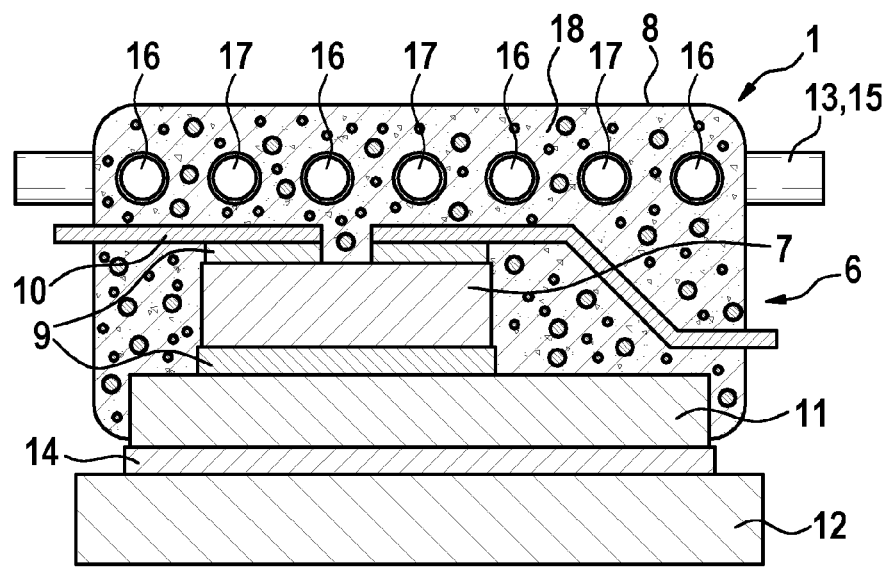

FIG. 2 shows an electronic module 6, especially a power module, having at least one electrical/electronic component 7, for example a transistor or an inductance, for example a transformer or a coil, and having a housing 8 that at least partly surrounds the component 7. The housing 8 is manufactured from the cement composite 1. The component 7 is preferably bonded by means of a conductive material 9, for example copper, silver or aluminum, firstly to an electrical contacting means 10, for example a metallic wire, and secondly to a substrate 11, for example a ceramic substrate. The conductive material 9 and the substrate 11 are preferably bonded to one another by means of DCB (direct copper bonding) or AMG (active metal brazing). The housing 9 is assigned at least one heat sink 12, 13. The heat sink 12 is preferably a copper body and is bonded to the substrate 11 especially by means of a joining material 14. The joining material is, for example, a metallic soft solder material or a polymeric TIM material.

The heat sink 13 preferably takes the form of a coolant duct 15 and extends through the cement composite 1 in such a way that sections of its longitudinal extent are completely surrounded by the cement composite 1. The coolant duct 15 is preferably in meandering form. For illustration of meandering form, it should be mentioned that the sections 16 come out of the plane of the paper and the sections 17 go into the plane of the paper. Preferably, the coolant duct 13 is a copper tube through which a cooling liquid, for example water, or a cooling gas, for example air, flows.

By means of the particularly advantageously heat-conducting cement composite 1, the heat that arises in operation of component 7 can effectively be guided into the heat sink(s) 12, 13. This allows a use temperature of component 7 to be increased to temperatures exceeding 200° C. The use of the heat sink(s) 12, 13 ensures that, for component 7, both cooling by the heat sink 12 and cooling by the heat sink 13 is possible.

Because the coolant duct 15 integrated within the cement composite 1 results in new design and also partitioning options independently of the heat sink 12 bonded to the substrate 11, it is possible to dispense with cooling by the heat sink 12. It is therefore preferably the case that the coolant duct 15 is provided as a single heat sink 13.

Figure 3:
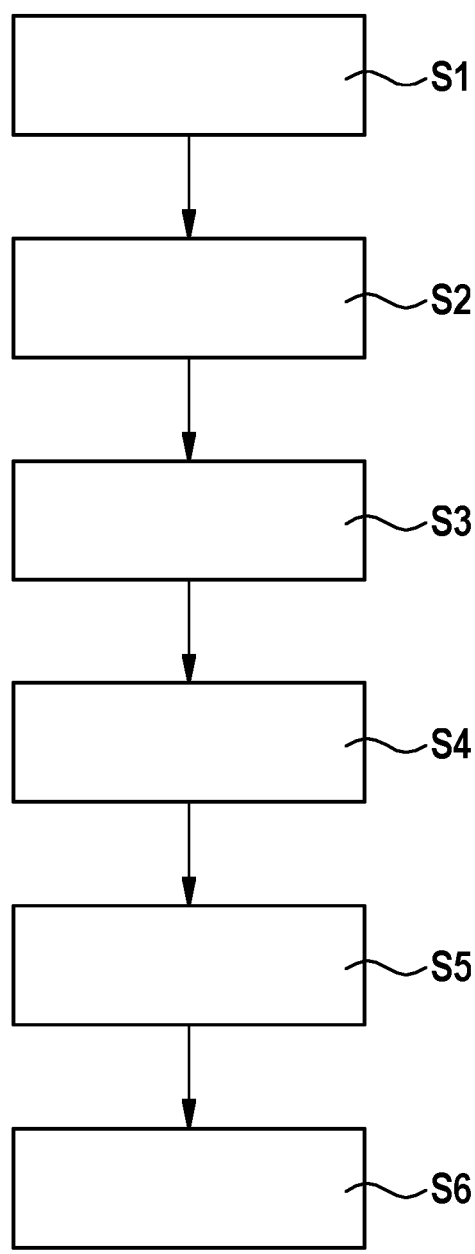

FIG. 3 shows a flow diagram for performance of a process for producing an electronic module 6, especially power module, in a working example.

In a first step S1, at least one electrical/electronic component 7 is provided. This component 7 is, for example, a transistor, an inductor, a transformer or another power module.

In a second step S2, a cement 18 or a base compound of the cement composite 1 is provided. Preferably, the cement 18 or the base compound of the cement composite 1 is manufactured from inorganic material. The inorganic material is preferably a cement, for example alumina cement, portland cement or phosphate cement. Further inorganic materials, especially additives, included in the cement 18 or the base compound of the cement composite 1 are, for example, ceramic, rock, sand and/or minerals.

In a third step S3, aluminum nitride particles 3 are provided. The aluminum nitride particles 3 are in the form of granular material or powder and preferably have a diameter of at least 0.1 µm to 500 µm. It is alternatively or additionally the case that the filler 2 is in suspension form.

In a fourth step S4, the aluminum nitride particles 3 are each provided with a coating solely of alumina 4. The provision with alumina 4 is preferably effected by a thermal oxidation of the aluminum nitride particles 3 under air at a temperature of preferably 1200° C. It is alternatively or additionally the case that, by means of a deposition process or coating method, the aluminum nitride particles 3 are coated with alumina 4. In this way, it is possible firstly to apply the alumina 4 with a definable layer thickness, preferably 1 nm to 100 nm, to the aluminum nitride particles 3. Secondly, it is possible in this way to apply a second coating including another material, for example silica, to the aluminum nitride particles 3. Suitable deposition processes are especially chemical and/or physical deposition processes, for example a chemical or physical gas phase deposition.

In a fifth step S5, the aluminum nitride particles 3 that have been provided with a coating solely of alumina 4 are introduced into the cement composite 1. The aluminum nitride particles 3 or the filler 2 are preferably mixed with the still-dry cement 18, especially the base compound. Alternatively or additionally, the filler 2 is mixed with a castable cement compound consisting of the base compound and/or at least one additive. For production of the castable cement composite compound, the base compound, the additives and/or the fillers 2 are preferably mixed first with one another and then with water. Preference is given to providing a monomodal admixture of the aluminum nitride particles 3 into the cement 18 or a multimodal admixture of the aluminum nitride particles 3. Preference is given to a bi- or trimodal admixture. Alternatively or additionally, at least one heat sink 12, 13 is assigned to the housing 8. In this way, the heat sink 12, 13 is encapsulated together with the component 7 in the cement composite 1. This ensures that the heat sink 12, 13 is cohesively bonded to the cement composite 1. This ensures a stable arrangement of the heat sink 12, 13 in the cement composite 1 and hence particularly advantageous conduction of heat from the component 7 through the cement composite 1 to the heat sink 12, 13.

In a sixth step S6, the component 7 and preferably further components of the electronic module 5, especially an electrical contacting means 10 and/or a substrate 11, are encapsulated at least partly with the cement composite 1 in order thus to produce a housing 8 at least partly surrounding the component 7. After the component 7 has been encapsulated, the castable, especially liquid, cement composite compound is set and dried. For encapsulation of the component 7, the component 7 is preferably surrounded by a casting mold (not shown here), which is filled with the castable cement composite compound. After the castable cement composite compound has set and dried, the casting mold is then removed from the dried cement composite compound or cement composite 1.

What is claimed is:

1. An electronic module (6) having at least one electrical/electronic component (7) and having a housing (8) that at least partly surrounds the component (7), wherein the housing (8) is manufactured from cement composite (1), and wherein the cement composite (1) includes cement (18) and at least one particulate filler (2), wherein the particulate filler (2) includes aluminum nitride particles (3) each having a coating solely of alumina (4), and wherein a heat sink (13) in the form of a coolant duct (15) extends through the cement composite (1) such that sections of a longitudinal extent of the coolant duct are surrounded completely by the cement composite (1).

2. The electronic module as claimed in claim 1, characterized in that the filler (2) is distributed homogeneously in the cement composite (1).

3. The electronic module as claimed in claim 1, characterized in that the filler (2) is a granular material or powder.

4. The electronic module as claimed in claim 1, characterized in that the cement (18) is manufactured from inorganic material.

5. The electronic module as claimed in claim 1, characterized in that the cement composite contains at least one further filler (5).

6. The electronic module as claimed in claim 5, wherein the at least one further filler (5) includes nitridic ceramic particles or SiC particles.

7. A process for producing an electronic module (6), comprising the following steps:
   providing at least one electrical/electronic component (7),
   providing a cement (18),
   providing aluminum nitride particles (3),
   providing the respective aluminum nitride particles (3) with a coating solely of alumina (4),
   introducing the aluminum nitride particles (3) provided with a coating solely of alumina (4) into the cement (18) for production of a cement composite (1),
   providing a heat sink (13) in the form of a coolant duct (15), and
   at least partly encapsulating the electrical/electronic component (7) and the heat sink (13) with the cement composite (1) to produce a housing (10), the heat sink (13) being encapsulated such that sections of a longitudinal extent of the coolant duct (15) are surrounded completely by the cement composite (1).

8. The process as claimed in claim 7, characterized in that the aluminum nitride particles (3) are provided with a coating solely of alumina (4) by oxidizing the aluminum nitride particles (3).

9. The process as claimed in claim 7, characterized in that the aluminum nitride particles (3) are provided with a coating solely of alumina (4) by applying the alumina (4) to the aluminum nitride particles (3) with a deposition process.

10. The process as claimed in claim 7, further comprising introducing at least one further filler (5) into the cement (18) for production of the cement composite (1).

11. The process as claimed in claim 10, wherein the at least one further filler (5) includes nitridic ceramic particles or SiC particles.

* * * * *